United States Patent
Lee (10) Patent No.: US 12,032,439 B2
(45) Date of Patent: Jul. 9, 2024

(54) MEMORY INCLUDING ERROR CORRECTION CIRCUIT AND OPERATION METHOD OF MEMORY

(71) Applicant: SK hynix Inc., Gyeonggi-do (KR)

(72) Inventor: Gang Sik Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/104,713

(22) Filed: Feb. 1, 2023

(65) Prior Publication Data

US 2024/0143438 A1 May 2, 2024

(30) Foreign Application Priority Data

Oct. 27, 2022 (KR) .......................... 10-2022-0140094

(51) Int. Cl.
*G06F 11/10* (2006.01)
*G11C 29/52* (2006.01)

(52) U.S. Cl.
CPC .......... *G06F 11/1044* (2013.01); *G11C 29/52* (2013.01)

(58) Field of Classification Search
CPC ...................................................... G06F 11/10
See application file for complete search history.

(56) References Cited

U.S. PATENT DOCUMENTS 10,810,079 B2 * 10/2020 Halbert ................. G06F 3/0679
11,195,568 B1    12/2021 Atishay et al.
2019/0073261 A1 *  3/2019 Halbert ................. G06F 3/0679

* cited by examiner

*Primary Examiner* — Samir W Rizk
(74) *Attorney, Agent, or Firm* — IP & T GROUP LLP (57) ABSTRACT

A memory includes: a memory core including memory regions; a refresh-excluded region storing circuit storing therein information on a refresh-excluded region on which a refresh operation is not to be performed among the memory regions; an error correction circuit correcting an error in data read from the memory core based on an error correction code read from the memory core; an error check operation control circuit performing an error check operation of checking an error in the read data by using the error correction circuit; a bad region classifying circuit classifying a selected memory region as a bad region based on an error, which is detected in data read from the selected memory region during the error check operation; and a blocking circuit preventing the bad region classifying circuit from classifying the refresh-excluded region as a bad region based on the information.

18 Claims, 6 Drawing Sheets

MEMORY INCLUDING ERROR CORRECTION CIRCUIT AND OPERATION METHOD OF MEMORY

CROSS-REFERENCE TO RELATED APPLICATIONS

The present application claims priority of Korean Patent Application No. 10-2022-0140094, filed on Oct. 27, 2022, which is incorporated herein by reference in its entirety.

BACKGROUND

1. Field

Various embodiments of the present invention relate to a memory.

2. Description of the Related Art

In the early stage of a semiconductor memory device industry, there were many originally good dies on the wafers, which means that memory chips were produced with no defective memory cells through a semiconductor fabrication process. However, as the capacity of memory devices increases, it becomes difficult to fabricate a memory device that does not have any defective memory cell, and nowadays, it may be said that there are substantially no chances that a memory device is fabricated without any defective memory cells. To address the issue, a repair method of including redundant memory cells in a memory device and replacing defective memory cells with the redundant memory cells is being used.

As another method, an error correction circuit (ECC circuit) for correcting errors in a memory system is used to correct errors occurring in memory cells and errors occurring when data are transferred during a read operation and a write operation of the memory system.

SUMMARY

Embodiments of the present invention are directed to a technology capable of efficiently checking errors of a memory.

In accordance with an embodiment of the present invention, a memory includes: a memory core including a plurality of memory regions; a refresh-excluded region storing circuit suitable for storing therein information on a refresh-excluded region on which a refresh operation is not to be performed among the memory regions; an error correction circuit suitable for correcting an error in data read from the memory core based on an error correction code read from the memory core; an error check operation control circuit suitable for performing an error check operation of checking an error in the read data by using the error correction circuit; a bad region classifying circuit suitable for classifying a selected memory region as a bad region based on an error, which is detected in data read from the selected memory region during the error check operation; and a blocking circuit suitable for preventing the bad region classifying circuit from classifying the refresh-excluded region as a bad region based on the information stored in the refresh-excluded region storing circuit.

In accordance with another embodiment of the present invention, a method for operating a memory includes: generating a first error check address; reading a first error correction code and first data from a first memory region that is selected based on the first error check address; detecting an error in the first data based on the first error correction code; and excluding the error of the first data from error logging when the first memory region is a refresh-excluded region.

In accordance with another embodiment of the present invention, a memory includes: a memory core including a plurality of memory regions; a refresh-excluded region storing circuit suitable for storing therein information on a refresh-excluded region on which a refresh operation is not to be performed among the memory regions; an error correction circuit suitable for correcting an error in data read from the memory core based on an error correction code read from the memory core; an error check operation control circuit suitable for performing an error check operation on a selected memory region by checking an error in data read from the selected memory region by using the error correction circuit; a bad region classifying circuit suitable for classifying the selected memory region as a bad region based on an error, which is detected in the data read from the selected memory region during the error check operation; and a region determining circuit suitable for activating an error check operation deactivation signal for preventing the error check operation control circuit from performing the error check operation on the selected memory region when the selected memory region is the refresh-excluded region.

In accordance with another embodiment of the present invention, a method for operating a memory includes: generating a first error check address; and skipping an error check operation on a first memory region that is selected based on the first error check address when the first memory region is a refresh-excluded region.

In accordance with another embodiment of the present invention, a method for operating a memory includes: self-refreshing remaining ones other than a selected one among a plurality of memory regions; and performing an error check and scrub (ECS) operation on at least the remaining memory regions to error-log one or more errors in data read from the remaining ones other than the selected one among the memory regions.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1:
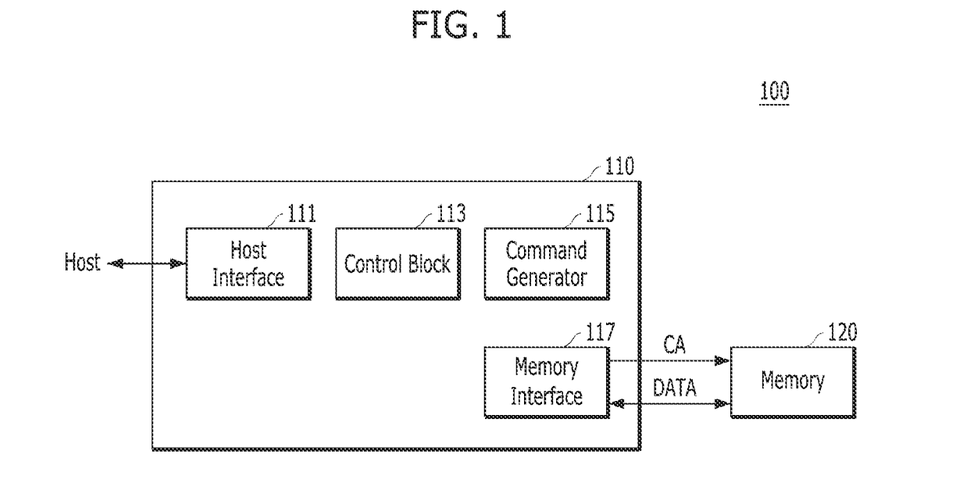
FIG. 1 is a block diagram illustrating a memory system in accordance with an embodiment of the present invention.

FIG. 1 is a block diagram illustrating a memory system 100 in accordance with an embodiment of the present invention.

The memory controller 110 may control the operation of a memory 120 according to a request of a host HOST. A host HOST may include a CPU (Central Processing Unit), a GPU (Graphic Processing Unit), an AP (Application Processor), or the like. The memory controller 110 may include a host interface 111, a control block 113, a command generator 115, and a memory interface 117. The memory controller 110 may be embedded in a CPU, a GPU, an AP, or the like. In this case, the host HOST may mean a configuration other than the memory controller 110 in the CPU, GPU, AP, or the like. For example, when the memory controller 110 is embedded in a CPU, the host HOST in FIG. 1 may represent the constituent elements other than the memory controller 110 in the CPU.

The host interface 111 may be an interface for communication between the host HOST and the memory controller 110.

The control block 113 may control overall operations of the memory controller 110 and schedule the operations to be directed to the memory 220. The control block 113 may make the order of the requests received from the host HOST and the order of the operations to be directed to the memory 120 be different in order to improve performance of the memory 120. For example, even though the host HOST requests the memory 120 to perform a read operation first and then to perform a write operation, the order may be adjusted in such a manner that a write operation may be performed prior to a read operation.

The command generator 115 may generate a command to be applied to the memory 120 according to the order of operations which is determined by the control block 113.

The memory interface 117 may be provided for an interface between the memory controller 110 and the memory 120. A command/address signal CA may be transferred from the memory controller 110 to the memory 120 through the memory interface 117 and data DATA may be transferred/received through the memory interface 117. The memory interface 117 may also be referred to as a PHY interface.

The memory controller 110 may control the memory 120 in an error check operation mode. When the control block 113 determines to operate the memory 120 in the error check operation mode, the command generator 115 may generate a command to control the memory 120 in the error check operation mode, and the memory interface 117 may transfer the command generated by the command generator 115 to the memory 120. The memory controller 110 may be able to request the memory 120 for information on a bad region collected during an error check operation and receive the information on the bad region from the memory 120.

The memory 120 may perform an operation directed by the memory controller 110. The memory 120 will be described in detail by referring to FIG. 2.

Figure 2:
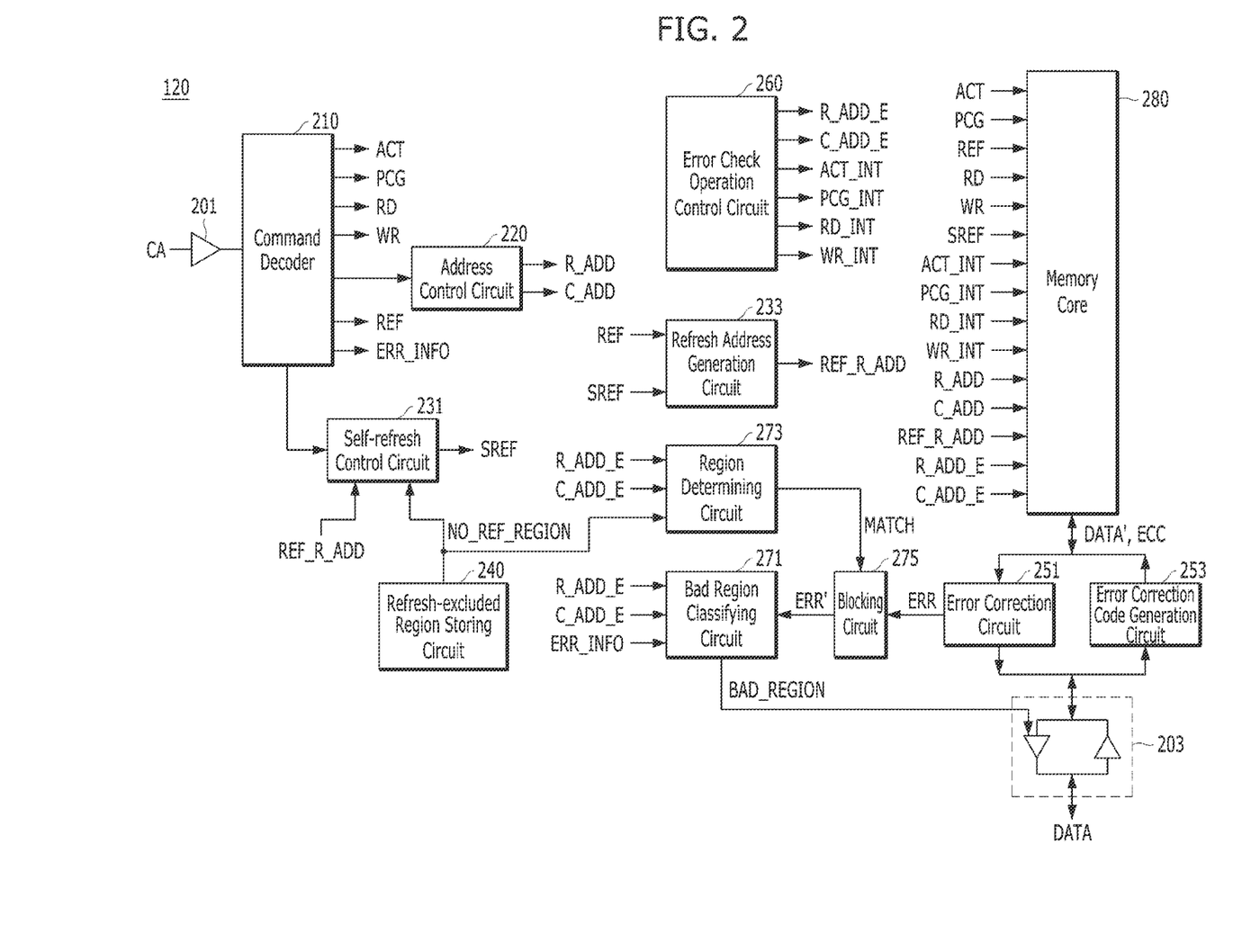
FIG. 2 is a detailed block diagram of a memory shown in FIG. 1 in accordance with an embodiment of the present invention.

FIG. 2 is a block diagram illustrating the memory 120 shown in FIG. 1 in accordance with an embodiment of the present invention.

Referring to FIG. 2, the memory 120 may include a command address receiving circuit 201, a data transferring/receiving circuit 203, a command decoder 210, an address control circuit 220, a self-refresh control circuit 231, a refresh address generation circuit 233, a refresh-excluded region storing circuit 240, an error correction circuit 251, an error correction code generation circuit 253, an error check operation control circuit 260, a bad region classifying circuit 271, a region determining circuit 273, a blocking circuit 275, and a memory core 280.

The command address receiving circuit 201 may receive a command/address signal CA. Depending on the type of the memory 120, a command and an address may be input through the same input terminals, or a command and an address may be input through separate input terminals. In this case, it is illustrated that the command and the address are input through the same input terminals. The command/address signal CA may be formed of multiple bits.

The data transferring/receiving circuit 203 may receive data DATA or transfer data DATA. The data transferring/receiving circuit 203 may receive data DATA to be written into the memory core 280 during a write operation, and may receive data DATA' that are read from the memory core 280 during a read operation.

The command decoder 210 may decode the command/address signal CA and determine the type of an operation directed by the memory controller 110 to the memory 120. An active signal ACT may be a signal which is activated when an active operation is directed, and a precharge signal PCG may be a signal which is activated when a precharge operation is directed. A refresh signal REF may be a signal which is activated when an (auto) refresh operation is directed. Also, a write signal WR may be a signal which is activated when a write operation is directed, and a read signal RD may be a signal which is activated when a read operation is directed. Also, an error information signal ERR_INFO may be a signal which is activated when there is a request for error information.

The address control circuit 220 may classify the address received from the command decoder 210 as a row address R_ADD or a column address C_ADD and transfer it to the memory core 280. The address control circuit 220 may classify the address as a row address R_ADD when it turns out as a result of the decoding by the command decoder 210 that an active operation is directed, and classify the address as a column address C_ADD when a read or write operation is directed.

The refresh-excluded region storing circuit 240 may store information on a refresh-excluded region in which a self-refresh operation is not to be performed in the memory core 280. In some cases, among the regions of the memory core, there may be regions that are not used or do not need to hold data. Since power may be wasted unnecessarily when a self-refresh operation is performed on these regions, these regions may be set and stored as refresh-excluded regions. Excluding some regions of the memory core 280 from a self-refresh operation may also be referred to as PASR (Partial Array Self-refresh).

The self-refresh control circuit 231 may activate a self-refresh signal SREF periodically in a self-refresh mode. The self-refresh mode may be set by the command decoder 210 which has received a direction from the memory controller 110. The self-refresh control circuit 231 may receive refresh-excluded region information NO_REF_REGION from the refresh-excluded region storing circuit 240, and when the row designated by the refresh address REF_R_ADD is included in a region designated by the refresh-excluded region information NO_REF_REGION, the self-refresh signal may not be activated. The self-refresh control circuit 231 may allow the self-refresh operation to be performed only in the regions that are not the refresh-excluded regions in the memory core 280.

The refresh address generation circuit 233 may generate a refresh address REF_R_ADD to be used for a refresh operation. Since only the row address is used for a refresh operation, the refresh address REF_R_ADD may be a row address. The refresh address REF_R_ADD may be used for an auto-refresh operation and a self-refresh operation. Whenever the auto-refresh operation or self-refresh operation is performed, that is, whenever the refresh signal REF or the self-refresh signal SREF is activated, the refresh address REF_R_ADD may be changed so that the rows of the memory core 280 may be sequentially refreshed.

The error correction circuit 251 may correct an error of the data DATA' based on an error correction code ECC, which are read from the memory core 280 during a read operation. Herein, correcting an error may mean detecting an error in the data DATA' and when an error is detected, correcting the detected error in the data DATA'. The error correction circuit 251 may also be able to detect and correct an error of the error correction code ECC together with the data DATA'. When an error in the data DATA' is detected and the detected error is corrected, the data DATA' input to the error correction circuit 251 and the data DATA output from the error correction circuit 251 may be different from each other. An error signal ERR may be a signal which is activated when an error is detected by the error correction circuit 251.

The error correction code generation circuit 253 may generate an error correction code ECC based on the data DATA received through the data transferring/receiving circuit 203, during a write operation. During the write operation, the error correction code ECC may be generated based on the data DATA, but the error of the data DATA may not be corrected. Therefore, the data DATA' output from the error correction code generation circuit 253 may be the same as the data DATA input to the error correction code generation circuit 253.

The error check operation control circuit 260 may control an error check operation of the memory 120. When it turns out as a result of the decoding by the command decoder 210 that an error check operation mode is directed by the memory controller 110, the memory 120 may operate in the error check operation mode, and in the error check operation mode, the memory 120 may operate under the control of the error check operation control circuit 260. The error check operation may also be referred to as an ECS (Error Check and Scrub) operation, which may mean an operation of reading the data DATA' from the memory core 280 and selecting a region with many errors occurring by checking the error of the data DATA' in the error correction circuit 251.

The error check operation control circuit 260 may generate an error check address R_ADD_E and C_ADD_E to be used for an error check operation. Since a row address and a column address are used in an error check operation, the error check address R_ADD_E and C_ADD_E may include a row address R_ADD_E and a column address C_ADD_E. The error check operation control circuit 260 may change the error check address R_ADD_E and C_ADD_E whenever the error check operation is performed so that the error check operation may be sequentially performed on the memory cells of the memory core 280.

The error check operation control circuit 260 may generate internal command signals ACT_INT, PCG_INT, RD_INT, and WR_INT for performing an error check operation. The error check operation control circuit 260 may sequentially activate an internal active signal ACT_INT, an internal read signal RD_INT, an internal write signal WR_INT, and an internal precharge signal PCG_INT during an error check operation. A row selected based on the error check row address R_ADD_E in the memory core 280 may be activated in response to the activation of the internal active signal ACT_INT. When the internal read signal RD_INT is activated, the data DATA' and the error correction code ECC may be read from the memory cells selected based on the error check column address C_ADD_E in the activated row of the memory core 280, and errors of the data DATA' may be checked and corrected by the error correction circuit 251 so as to produce error corrected data DATA. Then, as the internal write signal WR_INT is activated, the data DATA whose error is corrected by the error correction circuit 251 and an error correction code ECC which is re-generated by the error correction code generation circuit 253 based on the data DATA may be re-written into the memory cells where the read operation is performed.

The region determining circuit 273 may determine whether a region where an error check operation is performed is included in a refresh-excluded region or not. The region determining circuit 273 may be able to determine in which memory cells of the memory core 280 the error check operation is performed based on the error check address R_ADD_E and C_ADD_E, and to detect a refresh-excluded region based on the refresh-excluded region information NO_REF_REGION. The region determining circuit 273 may activate and output a match signal MATCH when the memory cells where the error check operation is performed are included in the refresh-excluded region.

The blocking circuit 275 may transfer the error signal ERR generated by the error correction circuit 251 to the bad region classifying circuit 271. When the match signal MATCH is deactivated, the blocking circuit 275 may transfer the error signal ERR to the bad region classifying circuit 271 as it is. That is, when the match signal MATCH is deactivated, the error signal ERR generated by the error correction circuit 251 is identical to an error signal ERR' transferred to the bad region classifying circuit 271. However, when the match signal MATCH is activated, the blocking circuit 275 may maintain the error signal ERR' transferred to the bad region classifying circuit 271 in a deactivated state. Namely, when the match signal MATCH is activated, the error signal ERR' may maintain the deactivated state, regardless of the level of the error signal ERR.

The bad region classifying circuit 271 may classify and store a bad region based on an error which is directed during an error check operation. For example, the bad region classifying circuit 271 may count the number of errors per row, and when the number of errors per row exceeds a threshold value, the bad region classifying circuit 271 may classify the corresponding row as a bad region. Since the bad region classifying circuit 271 receives the error check address R_ADD_E and C_ADD_E and the error signal ERR', it may be able to check where the error check operation is performed in the memory core 280 and whether an error is detected. When the match signal MATCH is activated, that is, when an error check operation is performed in the refresh-excluded region, the error signal ERR' may not be activated. Therefore, errors detected in the refresh-excluded region may not be logged by the bad region classifying circuit 271 during the error check operation, and regions classified as bad regions may not exist in the refresh-excluded region. It is possible to prevent a refresh-excluded region in which a lot of errors may occur because a refresh operation is not performed (because errors are allowed to occur) from being classified as a bad region by the bad region classifying circuit 271. When there is a request for error information from the memory controller 110, that is, when the error information signal ERR_INFO is activated, bad region information BAD_REGION which is classified and stored by the bad region classifying circuit 271 may be transferred to the memory controller 110 through the data transferring/receiving circuit 203.

The memory core 280 may perform operations directed by the signals ACT, PCG, REF, RD, WR, SREF, ACT_INT, PCG_INT, RD_INT, and WR_INT. The memory core 280 may include constituent elements for operations such as an active operation, a precharge operation, a read operation, and a write operation and the like. For example, the memory core 280 may include a cell array including memory cells that are arranged in a plurality of rows and a plurality of columns, a row decoder for activating/deactivating the rows of the cell array, and a column decoder and an input/output circuit for inputting/outputting data to/from the cell array. The memory core 280 may include a plurality of memory regions, and the cell array may be classified into the plurality of memory regions designated by a row address and a column address.

When the active signal ACT is activated, a row selected based on the row address R_ADD among the rows of the memory core 280 may be activated. When the precharge signal PCG is activated, the activated row may be deactivated. When the write signal WR is activated, the data DATA' and the error correction code ECC may be written into the columns that are selected based on the column address C_ADD among the columns of the memory core 280, and when the read signal RD is activated, the data DATA' and the error correction code ECC may be read from the columns that are selected based on the column address C_ADD among the columns of the memory core 280.

When the refresh signal REF or the self-refresh signal SREF is activated, a refresh operation where a row selected based on the refresh address REF_R_ADD among the rows of the memory core 280 is activated and then precharged may be performed.

Also, when the internal active signal ACT_INT is activated, a row selected based on the error check row address R_ADD_E among the rows of the memory core 280 may be activated. When the internal precharge signal PCG_INT is activated, the activated row may be deactivated. When the internal write signal WR_INT is activated, the data DATA' and the error correction code ECC may be written into the columns that are selected based on the error check column address C_ADD_E among the columns of the memory core 280. When the internal read signal RD_INT is activated, the data DATA' and the error correction code ECC may be read from the columns that are selected based on the error check column address C_ADD_E among the columns of the memory core 280.

Figure 3:
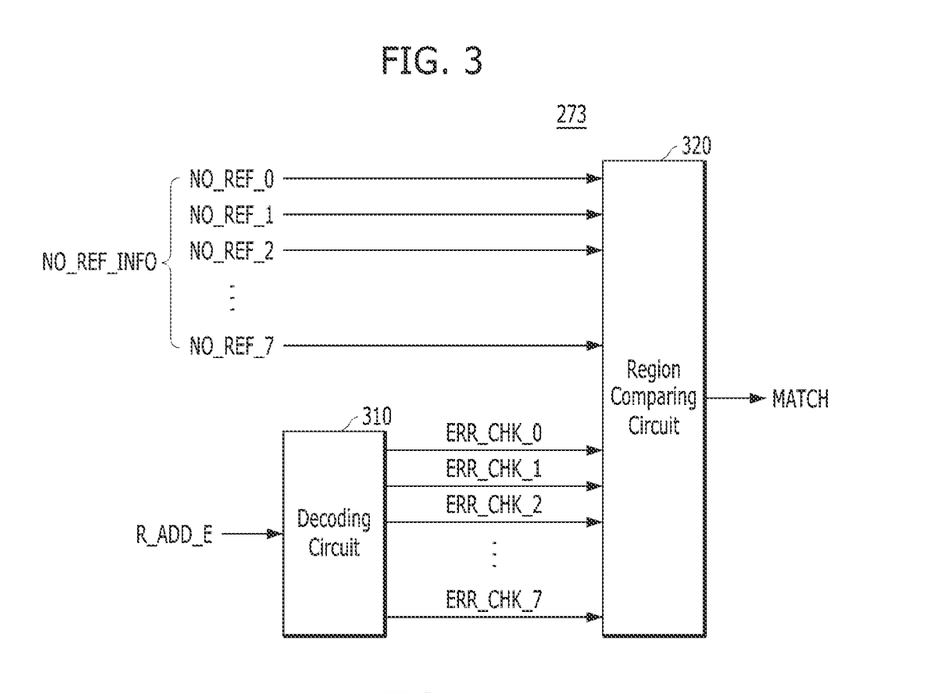
FIG. 3 is a detailed block diagram of a region determining circuit shown in FIG. 2 in accordance with an embodiment of the present invention.

FIG. 3 is a block diagram illustrating the region determining circuit 273 shown in FIG. 2 in accordance with an embodiment of the present invention.

Referring to FIG. 3, the region determining circuit 273 may include a decoding circuit 310 and a region comparing circuit 320.

The region determining circuit 273 may receive refresh-excluded region information NO_REF_REGION. The refresh-excluded region information NO_REF_REGION may include first to eighth refresh-excluded region signals NO_REF_0 to NO_REF_7. The refresh-excluded region signals NO_REF_0 to NO_REF_7 may be signals indicating which region is excluded from a refresh operation among the regions of the memory core 280. For example, when there are rows 0 to 7999 in the memory core 280, the first refresh-excluded region signal NO_REF_0 may be a signal indicating whether rows 0 to 999 are excluded from the refresh operation or not, and the second refresh-excluded region signal NO_REF_1 may be a signal indicating whether rows 1000 to 1999 are excluded from the refresh operation or not. The third refresh-excluded region signal NO_REF_2 may be a signal indicating whether rows 2000 to 2999 are excluded from the refresh operation or not, and the fourth refresh-excluded region signal NO_REF_3 may be a signal indicating whether rows 3000 to 3999 are excluded from the refresh operation or not. The fifth refresh-excluded region signal NO_REF_4 may be a signal indicating whether rows 4000 to 4999 are excluded from the refresh operation or not, and the sixth refresh-excluded region signal NO_REF_5 may be a signal indicating whether rows 5000 to 5999 are excluded from the refresh operation or not. The seventh refresh-excluded region signal NO_REF_6 may be a signal indicating whether rows 6000 to 6999 are excluded from the refresh operation or not, and the eighth refresh-excluded region signal NO_REF_7 may be a signal indicating whether rows 7000 to 7999 are excluded from the refresh operation or not.

When the third refresh-excluded region signal NO_REF_2 is activated, a self-refresh operation may not be performed for the rows 2000 to 2999 of the memory core 280. Likewise, when the fifth refresh-excluded region signal NO_REF_4 is activated, a self-refresh operation may not be performed for the rows 4000 to 4999 of the memory core 280. Since several regions of the memory core 280 may be excluded from a self-refresh operation, two or more signals among the refresh-excluded region signals NO_REF_0 to NO_REF_7 may be activated redundantly.

The decoding circuit 310 may decode an error check address R_ADD_E and generate first to eighth error check region signals ERR_CHK_0 to ERR_CHK_7. The error check region signals ERR_CHK_0 to ERR_CHK_7 may be signals indicating in which region an error check operation is performed among the regions corresponding to the first to eighth refresh-excluded region signals NO_REF_0 to NO_REF_7. For example, when an error check operation is performed in a row 2301 of the memory core 280, the decoding circuit 310 may activate the error check region signal ERR_CHK_2. Likewise, when an error check operation is performed in a row 5689 of the memory core 280, the decoding circuit 310 may activate the error check region signal ERR_CHK_5.

When an activated signal among the refresh-excluded region signals NO_REF_0 to NO_REF_7 and an activated signal among the error check region signals ERR_CHK_0 to ERR_CHK_7 designate the same region, the region comparing circuit 320 may determine that the region where an error check operation is performed is included in a refresh-excluded region and activate a match signal MATCH. For example, when the second refresh-excluded region signal NO_REF_1 and the second error check region signal ERR_CHK_1 are activated, the match signal MATCH may be activated. Likewise, when the sixth refresh-excluded region signal NO_REF_5 and the sixth error check region signal ERR_CHK_5 are activated, the match signal MATCH may be activated.

Herein, although it is illustrated that the refresh-excluded regions are distinguished on a row basis and the decoding circuit 310 decodes only the error check row address R_ADD_E, the decoding circuit 310 may also be able to decode the error check column address C_ADD_E depending on how the refresh-excluded regions are distinguished.

Figure 4:
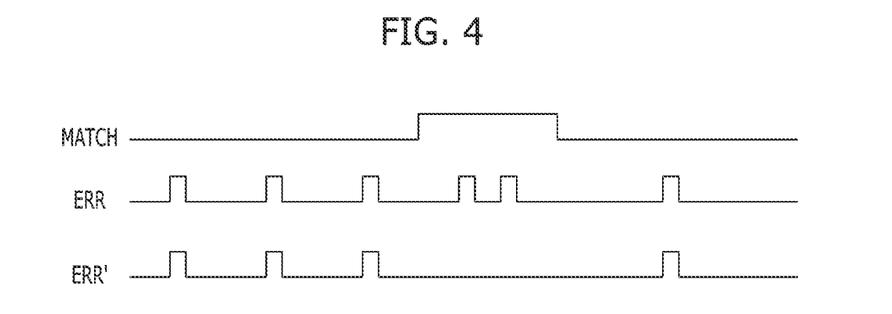
FIG. 4 is a waveform diagram illustrating an error signal ERR input to a blocking circuit shown in FIG. 2 and an error signal output from the blocking circuit in accordance with an embodiment of the present invention.

FIG. 4 is a waveform diagram illustrating an error signal ERR input to the blocking circuit 275 shown in FIG. 2 and an error signal ERR' output from the blocking circuit 275.

As described above, the error signal ERR may be a signal which is activated when an error is detected by the error correction circuit 251.

When the match signal MATCH is deactivated to a logic low level, the error signal ERR' may be activated whenever the error signal ERR is activated. In this case, the bad region classifying circuit 271 may log the error in response to the activated error signal ERR'. When the match signal MATCH is activated to a logic high level, the error signal ERR' may maintain the deactivated state even though the error signal ERR is activated. Accordingly, when the match signal MATCH is activated, that is, when an error check operation is performed in a region excluding refresh, the error may not be logged in the bad region classifying circuit 271 even though the error is detected.

Figure 5:
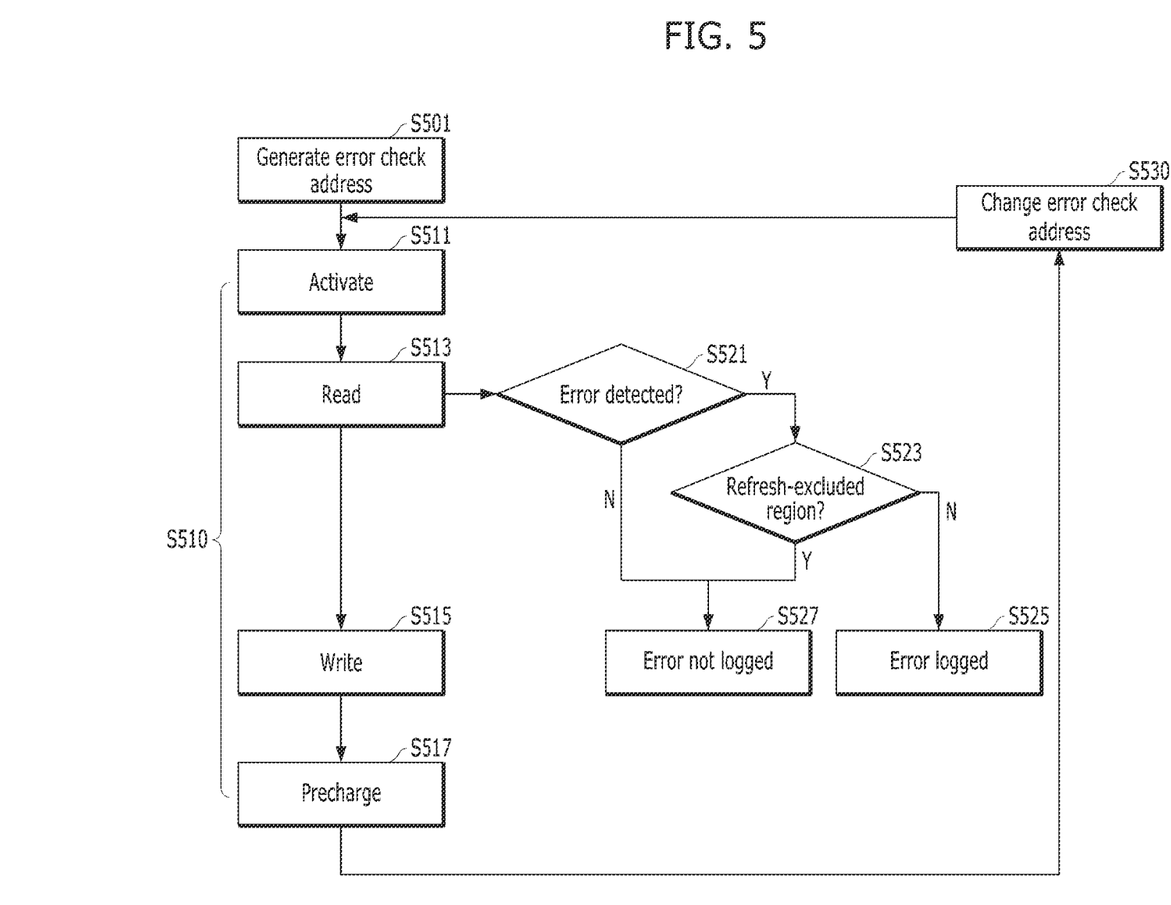
FIG. 5 is a flowchart for describing an error check operation of the memory shown in FIG. 2 in accordance with an embodiment of the present invention.

FIG. 5 is a flowchart for describing an error check operation of the memory 120 shown in FIG. 2 in accordance with an embodiment of the present invention.

Referring to FIG. 5, an error check address R_ADD_E and C_ADD_E may be generated by the error check operation control circuit 260 at operation S501.

Then, an error check operation using the error check address R_ADD_E and C_ADD_E may be performed at operation S510.

The error check operation control circuit 260 may activate an internal active signal ACT_INT and perform an active operation at operation S511. A row selected based on the error check row address R_ADD_E in the memory core 280 may be activated in response to the activation of the internal active signal ACT_INT.

The error check operation control circuit 260 may activate an internal read signal RD_INT and perform a read operation at operation S513. In response to activation of the internal read signal RD_INT, data DATA' and an error correction code ECC may be read from memory cells that are selected based on an error check column address C_ADD_E in the activated row of the memory core 280, and errors in the data DATA' may be checked by the error correcting circuit 251 and the errors may be corrected.

When an error is detected during the read operation of the operation S513 ('Y' at operation S521) and the region where the read operation of the operation S513 is performed is not included in a refresh-excluded region ('N' at operation S523), that is, when the error signal ERR is activated and the match signal MATCH is deactivated, the error may be logged by the bad region classifying circuit 271 at operation S525. Otherwise ('N' at the operation S521 and 'Y' at the operation S523), the error may not be logged at operation S527.

The error check operation control circuit 260 may activate an internal write signal WR_INT and perform a write operation at operation S515. The error correction code generation circuit 253 may generate an error correction code ECC based on the data DATA whose error has been corrected by the error correction circuit 251, and the data DATA' output from the error correction code generation circuit 253 and the error correction code ECC may be re-written into the memory cells where the read operation 513 has been performed.

The error check operation control circuit 260 may activate an internal precharge signal PCG_INT to precharge an active row in the memory core 280 at operation S517.

The error check operation control circuit 260 may change the error check address R_ADD_E and C_ADD_E at operation S530, and the error check operation of the operation S510 may be performed again.

As described above, in accordance with the embodiment, when an error is detected in a region other than the refresh-excluded region during the error check operation of the operation S510, the error may be logged by the bad region classifying circuit 271. However, when an error is detected in the refresh-excluded region, it may be confirmed that the error is not logged by the bad region classifying circuit 271. It is possible to prevent a refresh-excluded region where a lot of errors are to occur because a refresh operation is not performed (because errors are allowed to occur) from being classified as a bad region by the bad region classifying circuit 271.

Figure 6:
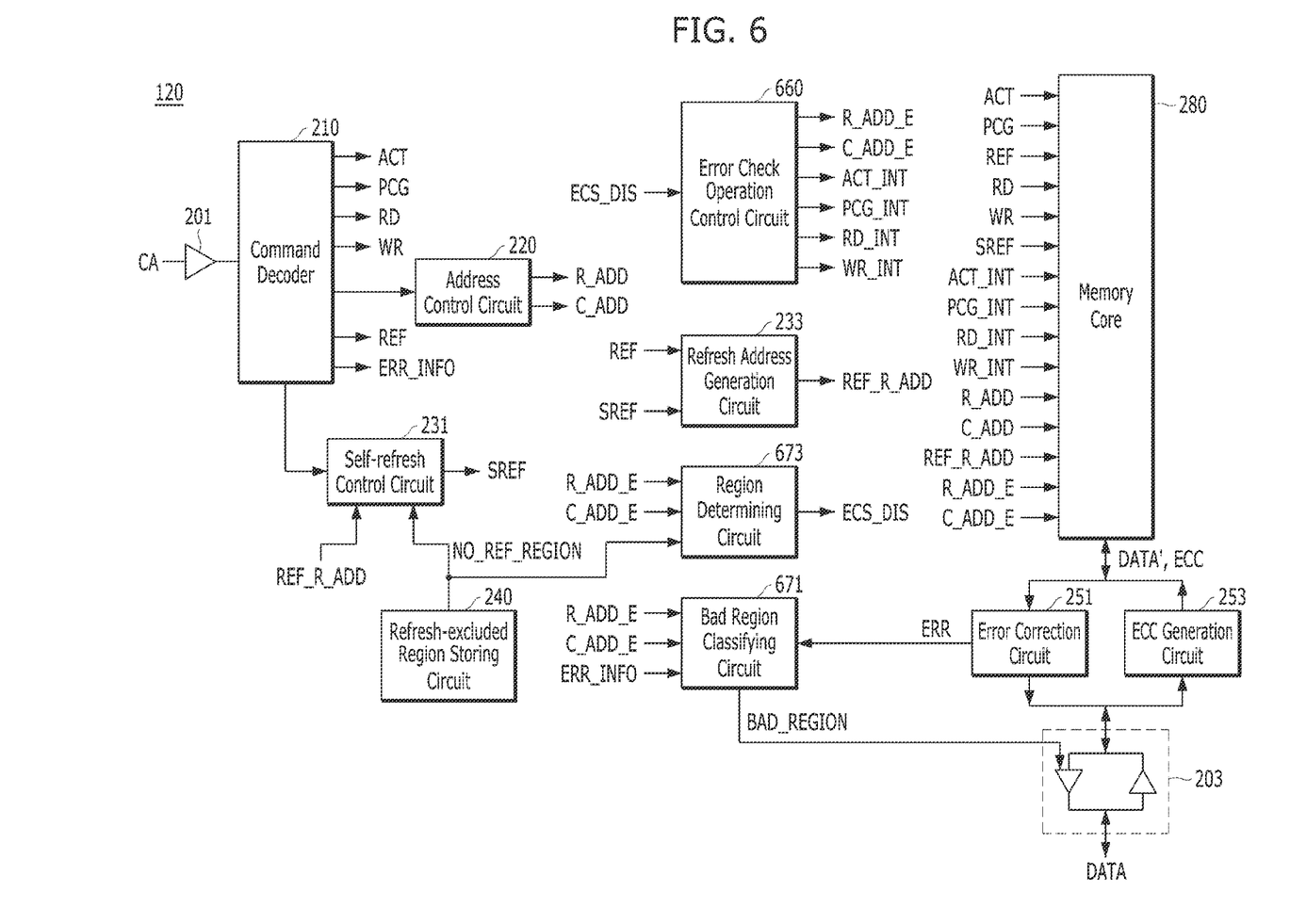
FIG. 6 is a detailed block diagram of the memory shown in FIG. 1 in accordance with another embodiment of the present invention.

FIG. 6 is a block diagram illustrating the memory 120 shown in FIG. 1 in accordance with another embodiment of the present invention.

In the embodiment of FIG. 2, when an error is detected in the refresh-excluded region during the error check operation of the memory 120, the error is not logged. In the embodiment of FIG. 6, however, an embodiment of the memory 120 in which an error check operation is not performed for a region excluding refresh will be described.

Referring to FIG. 6, the memory 120 may include a command address receiving circuit 201, a data transferring/receiving circuit 203, a command decoder 210, an address control circuit 220, a self-refresh control circuit 231, a refresh address generation circuit 233, a refresh-excluded region storing circuit 240, an error correction circuit 251, an error correction code generation circuit 253, an error check operation control circuit 660, a bad region classifying circuit 671, a region determining circuit 673, and a memory core 280.

The region determining circuit 673 may determine whether the memory cells that are selected based on the error check address R_ADD_E and C_ADD_E are included in a refresh-excluded region or not. When the memory cells that are selected based on the error check address R_ADD_E and C_ADD_E are included in a refresh-excluded region, the region determining circuit 673 may activate an error check operation deactivation signal ECS_DIS. The error check operation deactivation signal ECS_DIS may be the same signal as the match signal MATCH generated by the region determining circuit 273 in FIG. 2, and the region determining circuit 673 of FIG. 6 may be formed in the same manner as in FIG. 3. However, since the use of the signal ECS_DIS generated by the region determining circuit 673 is different from that of the signal MATCH generated by the region determining circuit 273, the signal is named differently.

The error check operation control circuit 660 may generate the error check address R_ADD_E and C_ADD_E in the same manner as the error check operation control circuit 260 of FIG. 2 does, and generate internal command signals ACT_INT, PCG_INT, RD_INT, and WR_INT to control the error check operation of the memory 120. The error check operation control circuit 660 may not activate the internal command signals ACT_INT, PCG_INT, RD_INT, and WR_INT when the error check operation deactivation signal ECS_DIS is activated. Since the error check operation control circuit 660 does not activate the internal command signals ACT_INT, PCG_INT, RD_INT, and WR_INT when the memory cells designated by the error check address R_ADD_E and C_ADD_E are included in the refresh-excluded region, the error check operation may not be performed in the refresh-excluded region.

Since an error check operation is not performed in the refresh-excluded region, the memory cells in the refresh-excluded region may not be classified as bad regions by the bad region classifying circuit 271.

Figure 7:
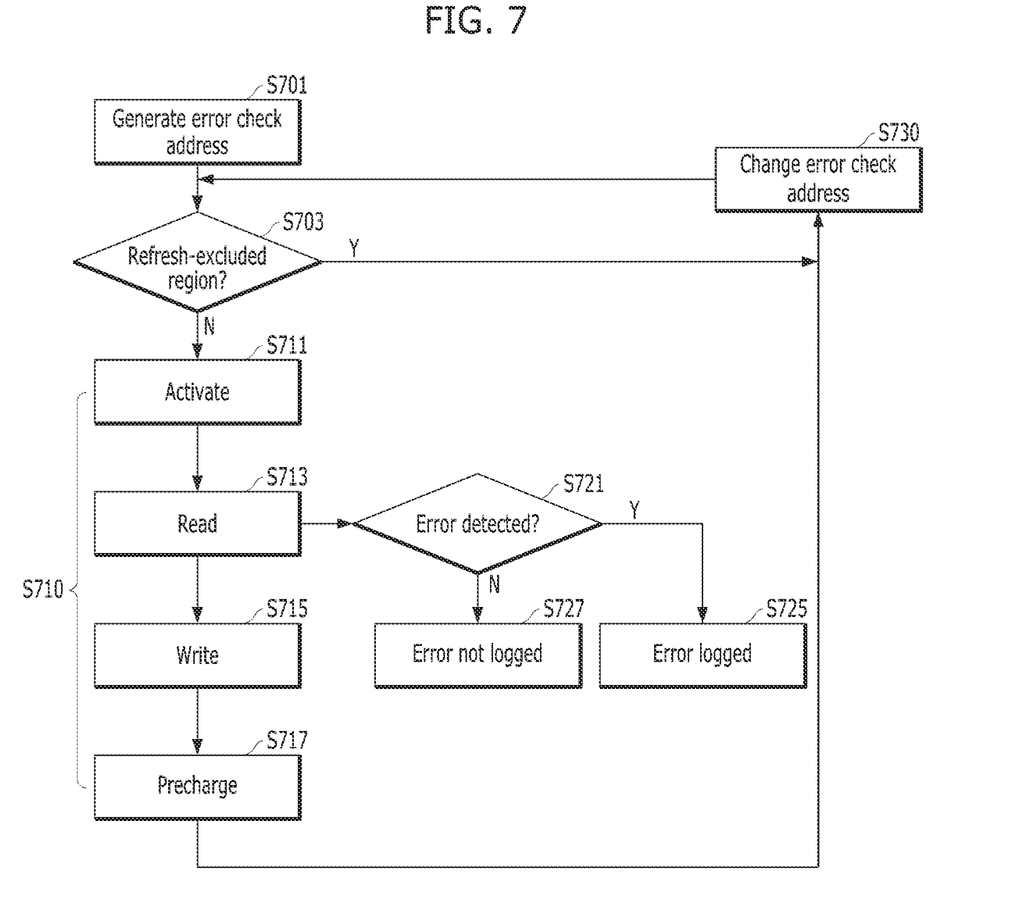
FIG. 7 is a flowchart for describing an error check operation of the memory shown in FIG. 6 in accordance with an embodiment of the present invention.

FIG. 7 is a flowchart for describing an error check operation of the memory 120 shown in FIG. 6 in accordance with an embodiment of the present invention.

Referring to FIG. 7, the error check address R_ADD_E and C_ADD_E may be generated by the error check operation control circuit 660 at operation S701.

The region determining circuit 673 may determine whether the memory cells that are selected based on the error check address R_ADD_E and C_ADD_E are included in the refresh-excluded region or not at operation S703. When the memory cells that are selected based on the error check address R_ADD_E and C_ADD_E are included in the refresh-excluded region ('Y' at the operation S703), that is, when the error check operation deactivation signal ECS_DIS is activated, the error check operation may be skipped. When the memory cells that are selected based on the error check address R_ADD_E and C_ADD_E are not included in the refresh-excluded region ('N' at the operation S703), that is, when the error check operation deactivation signal ECS_DIS is deactivated, the error check operation may be performed at operation S710.

The error check operation control circuit 660 may activate the internal active signal ACT_INT and perform an active operation at operation S711. A row selected based on the error check row address R_ADD_E in the memory core 280 may be activated in response to the activation of the internal active signal ACT_INT.

The error check operation control circuit 660 may activate the internal read signal RD_INT and perform a read operation at operation S713. In response to the activation of the internal read signal RD_INT, the data DATA' and the error correction code ECC may be read from the memory cells that are selected based on the error check column address C_ADD_E in the activated row of the memory core 280, and the errors in the data DATA' may be checked and corrected by the error correcting circuit 251.

When an error is detected during the read operation of the operation S713 ('Y' at operation S721), that is, when the error signal ERR is activated, the error may be logged by the bad region classifying circuit 671 at operation S725. Otherwise ('N' at the operation S721), the error may not be logged at operation S727.

The error check operation control circuit 660 may activate the internal write signal WR_INT and perform a write operation at operation S715. The error correction code generation circuit 253 may generate an error correction code ECC based on the data DATA whose error has been corrected by the error correction circuit 251, and the data DATA' output from the error correction code generation circuit 253 and the error correction code ECC may be re-written into the memory cells where the read operation of the operation S713 has been performed.

The error check operation control circuit 660 may pre-charge the activated row in the memory core 280 by activating an internal precharge signal PCG_INT at operation S717.

The error check operation control circuit 660 may change the error check address R_ADD_E and C_ADD_E at operation S730, and when the condition of the operation S703 is satisfied, the error check operation 710 may be performed.

As described above, in accordance with the embodiment, when memory cells that are selected based on error check address R_ADD_E and C_ADD_E are included in a refresh-excluded region, an error check operation may be skipped. It is possible to prevent an error check operation from being unnecessarily performed for a refresh-excluded region where a lot of errors are to occur because a refresh operation is not performed (because errors are allowed to occur).

According to embodiments of the present invention, a memory may be efficiently checked for errors.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory comprising:
a memory core including a plurality of memory regions;
a refresh-excluded region storing circuit suitable for storing therein information on a refresh-excluded region where no valid data is stored, on which a refresh operation is not to be performed among the memory regions;
an error correction circuit suitable for correcting an error in data read from the memory core based on an error correction code read from the memory core;
an error check operation control circuit suitable for performing an error check operation of checking an error in the read data by using the error correction circuit;
a bad region classifying circuit suitable for classifying a selected memory region as a bad region based on an error, which is detected in data read from the selected memory region during the error check operation; and
a blocking circuit suitable for preventing the bad region classifying circuit from classifying the refresh-excluded region as a bad region based on the information stored in the refresh-excluded region storing circuit.

2. The memory of claim 1, further comprising:
a region determining circuit suitable for determining whether the selected memory region is the refresh-excluded region or not to produce a determination result and transferring the determination result to the blocking circuit,
wherein the blocking circuit prevents the bad region classifying circuit from classifying the selected memory region as a bad region when the selected memory region is the refresh-excluded region.

3. The memory of claim 2,
wherein the bad region classifying circuit is further suitable for: receiving, through the blocking circuit, an error signal which is activated when an error is detected by the error correction circuit, and receiving an error check address which is used for the error check operation, and wherein the blocking circuit prevents the bad region classifying circuit by maintaining, to a deactivated state, the error signal to be transferred to the bad region classifying circuit when the region determining circuit determines that the selected memory region is the refresh-excluded region.

4. The memory of claim 2, wherein:
the memory regions include first to Nth regions where N is an integer of 2 or greater,
the information on the refresh-excluded region includes first to Nth refresh-excluded region signals each for indicating whether a corresponding one among the first to Nth regions is the refresh-excluded region, and
the region determining circuit includes:
   a decoding circuit suitable for decoding an error check address which is used for the error check operation to generate first to Nth error check region signals each indicating whether a corresponding one among the first to Nth regions is the selected memory region based on the error check address; and
   a region comparing circuit suitable for determining the selected memory region as the refresh-excluded region when an activated signal among the first to Nth refresh-excluded region signals and an activated signal among the first to Nth error check region signals indicate the selected memory region among the first to Nth regions.

5. The memory of claim 1, wherein the refresh operation is a self-refresh operation.

6. A method for operating a memory, the method comprising:
generating a first error check address;
reading a first error correction code and first data from a first memory region that is selected based on the first error check address;
detecting an error in the first data based on the first error correction code; and
excluding the error of the first data from error logging when the first memory region is a refresh-excluded region where no valid data is stored.

7. The method of claim 6, further comprising:
logging the error of the first data when the first memory region is not the refresh-excluded region.

8. The method of claim 6, wherein the refresh-excluded region is a region where a self-refresh operation is not performed.

9. A memory comprising:
a memory core including a plurality of memory regions;
a refresh-excluded region storing circuit suitable for storing therein information on a refresh-excluded region where no valid data is stored, on which a refresh operation is not to be performed among the memory regions;
an error correction circuit suitable for correcting an error in data read from the memory core based on an error correction code read from the memory core;
an error check operation control circuit suitable for performing an error check operation on a selected memory region by checking an error in data read from the selected memory region by using the error correction circuit;
a bad region classifying circuit suitable for classifying the selected memory region as a bad region based on an error, which is detected in the data read from the selected memory region during the error check operation; and a region determining circuit suitable for activating an error check operation deactivation signal for preventing the error check operation control circuit from performing the error check operation on the selected memory region when the selected memory region is the refresh-excluded region.

10. The memory of claim 9, wherein:
the error check operation control circuit performs the error check operation by generating an error check address which is used in the error check operation and internal command signals for performing the error check operation, and
the error check operation control circuit is further suitable for deactivating the internal command signals when the error check operation deactivation signal is activated.

11. The memory of claim 10, wherein the region determining circuit is further suitable for determining whether the selected memory region is the refresh-excluded region or not based on the error check address and the information on the refresh-excluded region.

12. The memory of claim 10, wherein:
the memory regions include first to Nth regions, where N is an integer of 2 or greater,
the information on the refresh-excluded region includes first to Nth refresh-excluded region signals each for indicating whether a corresponding one among the first to Nth regions is the refresh-excluded region, and
the region determining circuit includes:
   a decoding circuit suitable for decoding the error check address to generate first to Nth error check region signals each indicating whether a corresponding one among the first to Nth regions is the selected memory region based on the error check address; and
   a region comparing circuit suitable for determining the selected memory region as the refresh-excluded region when an activated signal among the first to Nth refresh-excluded region signals and an activated signal among the first to Nth error check region signals indicate the selected memory region among the first to Nth regions.

13. The memory of claim 9, wherein the refresh operation is a self-refresh operation.

14. A method for operating a memory, the method comprising:
generating a first error check address; and
skipping an error check operation on a first memory region that is selected based on the first error check address when the first memory region is a refresh-excluded region where no valid data is stored.

15. The method of claim 14, further comprising:
performing the error check operation on the first memory region when the first memory region is not the refresh-excluded region.

16. The method of claim 14, wherein the refresh-excluded region is a region where a self-refresh operation is not performed.

17. An operating method of a memory, the operating method comprising:
self-refreshing remaining ones other than a selected one among a plurality of memory regions, wherein the selected one is a memory region where no valid data is stored; and
performing an error check and scrub (ECS) operation on at least the remaining memory regions to error-log one or more errors in data read from the remaining ones other than the selected one among the memory regions.

18. The operating method of claim 17, wherein the ECS operation is performed further on the selected memory region.

\* \* \* \* \*